United States Patent
Eckert

(12) 
(10) Patent No.: US 6,377,902 B1
(45) Date of Patent: Apr. 23, 2002

(54) ARRANGEMENT FOR CONTINUOUS AND UNINTERRUPTED READING OF A LARGE VOLUME OF DATA FROM AN ELECTRONIC MEASURING DEVICE INTO A MEMORY

(75) Inventor: Hagen Eckert, Mering (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 09/365,205

(22) Filed: Aug. 2, 1999

(30) Foreign Application Priority Data

Aug. 27, 1998 (DE) .......................................... 198 39 121

(51) Int. Cl.⁷ .............................................. G06F 15/16
(52) U.S. Cl. .......................................... 702/127; 710/61
(58) Field of Search .............................. 702/127, 1, 85, 702/108; 710/5, 12, 13, 19, 30, 52, 61, 262; 711/1, 4, 100, 105, 111, 154, 170; 360/55, 69; 369/53.36

(56) References Cited

U.S. PATENT DOCUMENTS

| 5,617,367 A | * | 4/1997 | Holland et al. | 365/219 |
|---|---|---|---|---|
| 5,661,848 A | * | 8/1997 | Bonke et al. | 711/112 |
| 5,668,789 A | * | 9/1997 | Yokota et al. | 369/47 |
| 5,805,821 A | * | 9/1998 | Saxena et al. | 711/112 |
| 5,815,418 A | * | 9/1998 | Dolazza et al. | 702/86 |
| 5,936,924 A | * | 8/1999 | Tanaka | 369/47.52 |
| 5,953,684 A | * | 9/1999 | Alexander | 702/108 |
| 6,088,794 A | * | 7/2000 | Yoon et al. | 713/2 |
| 6,136,274 A | * | 10/2000 | Nova et al. | 422/102 |
| 6,173,363 B1 | * | 1/2001 | Tsuyuguchi | 711/115 |

* cited by examiner

*Primary Examiner*—N. Le
*Assistant Examiner*—Edward Raymond
(74) *Attorney, Agent, or Firm*—Schiff Hardin & Waite

(57) ABSTRACT

A circuit for the continuous and uninterrupted read-in of a large data volume of an electronic measuring device into a memory, having at least two dynamic storage elements (2a, 2b) each of which can accept only one data volume uninterrupted during an active phase (which data volume is limited relative to the total data volume to be read in) and must be prepared again for a new read-in during an inactive phase. These storage elements are so controlled via a control circuit (3) that during the inactive phase of a first storage element (e.g. 2a), the data are read into a second storage element (e.g. 2b) which is prepared for the active phase, and when this second storage element must be prepared again, there is an automatic and uninterrupted changeover to another storage element (e.g. 2a) which is already prepared for the active phase, until the total data volume is read in.

6 Claims, 1 Drawing Sheet

ARRANGEMENT FOR CONTINUOUS AND UNINTERRUPTED READING OF A LARGE VOLUME OF DATA FROM AN ELECTRONIC MEASURING DEVICE INTO A MEMORY

BACKGROUND OF THE INVENTION

In modern electronic measuring devices such as spectrum analyzers or network analyzers, the analog measurement data are sampled and digitized with a high-speed analog/digital converter and are stored in a memory for later processing. It is important that the reading of the data into the memory occur continuously and uninterrupted within the measuring time that is predetermined by the measuring device, since data gaps can falsify the measuring result and render it unusable for a further processing. Therefore, static memories (RAM, or respectively, SRAM) have been used exclusively for the storage in measuring devices of this type. However, the storage size of such static memories is limited for technological reasons, thus necessitating the use of many storage modules for receiving large data volumes during long measuring times.

Modern synchronous dynamic memories (DRAM, or respectively, SDRAM) such as are used in digital computers do have a large storage capacity, but they cannot be used for continuous uninterrupted data recording during a long measuring time, since they periodically require what are known as preparatory (or priming) phases at definite time intervals, of 4 or 8 measuring values, for example, by which phases a continuous reading, of a large data volume is interrupted. Further, despite their high recording speed, on average, such dynamic memories have a relatively low recording speed as a consequence of the required preparatory times. In addition, such dynamic memories require refreshing processes at defined time intervals so that the memory contents are not falsified. For this reason, such dynamic memories have until now usually been used only in digital computers, where short-term delays due to refreshing, or respectively, preparatory times do not play a role.

With additional storage modules (FIFO) which intermediately store the continuous data stream for the length of a read-in phase, for example, such dynamic memories could be expanded even for continuous and uninterrupted read-in of a large data volume; however, this requires a relatively large and expensive hardware outlay, and the achievable average read-in speed becomes even lower.

In dynamic memories of this type, it is known per se to execute refreshing processes in one part of the memory at the same time as storage cycles are being executed in another part of the memory. See German patent document DE-AS 22 47 835, or respectively, German patent 26 37 004.

There is also known an arrangement from East German patent document DD 28174 in which the storage elements can respectively record only a single data word before a new preparation is already required. Furthermore, with this known arrangement, only data word sequences that can be divided by two can be read in without data loss, since all the data words with even addresses are read into one storage element, and all the data words with odd addresses are read into the other storage element, respectively.

SUMMARY OF THE INVENTION

An object of the invention is to provide an arrangement that, with the lowest possible wiring outlay, an arbitrarily large data volume can be read into a memory continuously and uninterrupted during an arbitrarily long measuring time, without data being lost.

To that end, in an embodiment, the invention provides a circuit for the continuous and uninterrupted read-in of a given volume of data from an electronic measuring device, into a memory, comprising:

at least two dynamic storage elements having an active phase and an inactive phase; and a controller operatively connected and configured to control said dynamic storage elements, the controller configured to direct said data to a dynamic storage element prepared for its active phase while another storage element is in its inactive preparatory phase.

In an embodiment, the invention also provides that the controller is configured to control refreshing of the storage elements such that the data in the storage elements are refreshed only after completion of the read-in of all of the entire volume of data from the electronic measuring devices.

In the inventive arrangement, several consecutive data words are read in each storage element, respectively, such as 8, 256, 512 or 1024 data words in succession, for example, which are respectively preceded by a single preparatory time of only six data words, for example. It is thus possible to read in arbitrarily long odd data word sequences, which is particularly advantageous if the read-in of the data from a data generator is to occur into a ring memory. periodically and synchronously and so an odd data sequence length is selected. In the inventive arrangement, the data word sequence which is respectively read into a storage element during the active phase could also be shortened by one or more data words without resulting in data loss.

An inventive arrangement can be constructed quite economically with conventional DRAMs; thus, an expensive FIFO memory becomes superfluous. In addition, the high read-in speed of such DRAMs can be fully exploited, and a high read-in speed of the overall arrangement is thus achieved.

These and other features of the invention are discussed in greater detail below in the following detailed description of the presently preferred embodiments with reference to the accompanying drawings:

DETAILED DESCRIPTION OF THE PRESENTLY PREFERRED EMBODIMENTS

Figure 1:
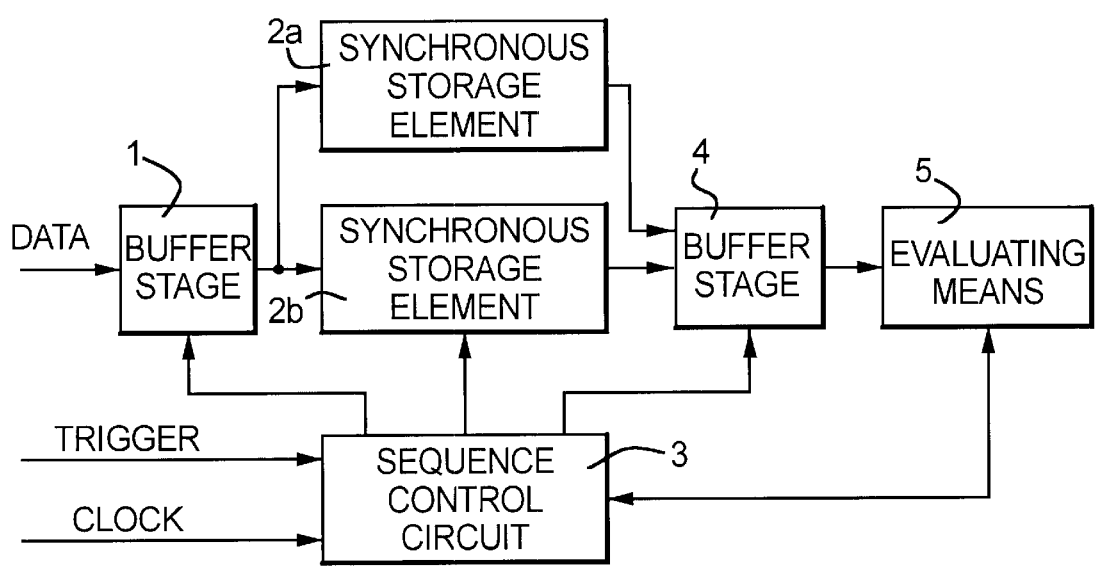
FIG. 1 illustrates a basic circuit diagram of an inventive arrangement.

According to FIG. 1, at the input of the memory arrangement of an electronic measuring device (e.g. a spectrum or network analyzer), the digitized measuring signals are fed directly from the analog/digital converter to a buffer stage 1 and from there to the data lines of two synchronous storage elements (e.g., DRAM) 2a and 2b that are connected in parallel. A sequence control circuit 3 generates the address and control signals for the sequential writing of the digitized measurement signals into the rows and columns of the storage elements 2a and 2b and also for the refreshing of the .memory contents of the storage elements 2a and 2b subsequent to the completion of the measurement value acceptance.

Both the clock of the incoming data and a trigger signal are fed to a sequence control circuit 3. Control dependent on the trigger signal can occur such that a predetermined number of measurement values are read into the storage elements 2a and 2b during a predetermined measuring time subsequent to the arrival of a trigger signal.

Another scheme for triggering resides in a predetermined number of measurement values could already have been stored during a predetermined measurement time prior to the arrival of a trigger signal, and the measurement value acceptance is then ended by the trigger signal.

A third scheme for triggering is that measurement values can be stored during a predetermined time period prior to a trigger signal, and then a predetermined number of measurement values are stored again subsequent to the trigger signal.

For the last two above-described triggering schemes, a continuous data stream must be read into the storage elements 2a, 2b over a time period which is far longer than the actual measuring time, since the chronological arrival of the trigger signal is not known beforehand.

A fourth triggering scheme resides in tapping the trigger signal directly from the data current, by a digital threshold decider, by a digital RMS detector or subsequent to demodulation of the data.

The data which are read into the storage elements 2a, 2b are fed via a buffer stage 4 to an evaluating means 5 such as a digital computer, which is connected via a control line to the sequence control circuit 3, by means of which it is possible to access the stored measurement values in the storage elements 2a, 2b subsequent to the data acceptance.

For uninterrupted recording of an arbitrarily long measurement data sequence, the control of the two storage elements 2a, 2b occurs by means of the sequence control circuit 3 as follows:

a) During an active phase, measurement data are read into the storage element 2a, while the storage element 2b is in its inactive phase and is being prepared for new data acceptance.

b) When the storage element 2a has reached its defined storage capacity, it is automatically switched into its inactive phase, in which preparation for new data read-in occurs. At the same time, the storage element 2b is switched into its active phase and accepts data on its part, without loss of measurement data.

c) When the storage element 2b has reached its defined recording length, there occurs a changeover to the storage element 2a again, and the cycle repeats itself until the predetermined measuring time is completed and the entire data volume is stored.

Figure 2:
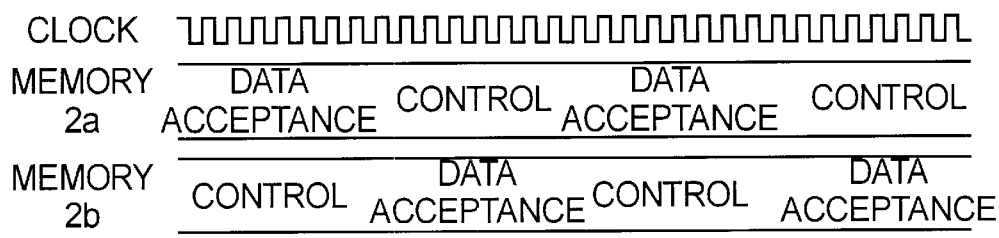
FIG. 2 illustrates a data read-in scheme for a data length of 8 measurement values during an active phase.

The foregoing sequence of alternately inactive and active phases of the two storage elements 2a and 2b is illustrated in FIG. 2. The preparatory phase which precedes each storage process is relatively short in modern storage elements of this type, equaling only 2 to 4 data words, for example. The subsequent-active phase is relatively longer in modern storage elements of this type, equaling 4, 8 or 256 data words, for example. In the exemplary embodiment according to FIG. 2, a data volume of 8 data words, i.e. 8 measurement values, is accepted. However, it is understood that other values are contemplated.

Subsequent to the read-in of the total data volume of a measurement process, the read-in process is finished via the sequence control circuit 3, and the refreshing generators that are integrated in the storage elements 2a and 2b are activated, so that the storage elements hold their stored data until the readout of the data into the computer 5. The readout of the data from the storage elements into the computer 5 via the buffer stage 4 can occur sequentially or randomly.

The storage elements and the sequence control circuit can preferably be integrated in a single module. The type of data to be stored can be arbitrary; it can also be a matter of signals of two or more channels, such as IQ signals. In such a case it is merely necessary to provide correspondingly more storage elements and to correspondingly control these via the sequence control circuit. Moreover, in the exemplary embodiment, only two storage elements 2a and 2b are illustrated; more such storage elements can be connected in parallel, as needed, if greater storage capacities are required.

Although modifications and changes may be suggested by those skilled in the art, it is the intention of the inventors to embody within the patent warranted hereon all changes and modifications as reasonably and properly come within the scope of their contribution to the art.

What is claimed is:

1. A circuit for the continuous and uninterrupted read-in of a given volume of data from an electronic measuring device into a memory, the circuit comprising:

said memory that further comprises at least two dynamic storage elements having an active phase and an inactive phase and said dynamic storage elements being connected in parallel; and a controller operatively connected and configured to control said dynamic storage elements, said controller configured in a way that at any time during read-in of a given volume of data, one of said dynamic storage elements is in its active phase; and that said controller is configured to direct said data to a dynamic storage element prepared for its active phase while another dynamic storage element is in its inactive preparatory phase.

2. The circuit of claim 1, wherein said controller is configured to control refreshing of said dynamic storage elements such that data in the dynamic storage elements are refreshed only after completion of said read-in of all of the entire volume of data from said electronic measuring device.

3. The circuit of claim 1, wherein said controller is configured such that data stored in a given dynamic storage element is read out from said dynamic storage element during said inactive phase.

4. A circuit for the continuous and uninterrupted read-in of a given volume of data from an electronic measuring device into a memory, the circuit comprising:

said memory that further comprises at least two dynamic storage elements having an active phase and an inactive phase and said dynamic storage elements being connected in parallel; and a controller operatively connected and configured to control said dynamic storage elements, said controller configured to direct said data to a dynamic storage element prepared for its active phase while another storage element is in its inactive preparatory phase, control of said two storage elements occurring by said controller being configured to operate as follows:

a) during an active phase, measurement data are read into a first storage element, while a second dynamic storage element is in its inactive phase and is being prepared for new data acceptance;

b) when said first dynamic storage element has reached its defined storage capacity, it is automatically switched into its inactive phase, in which preparation for new data read-in occurs while at the same time, said second dynamic storage element is switched into its active phase and accepts data on its part, without loss of measurement data; and c) when said second dynamic storage element has reached its defined recording length, there occurs a changeover to said first dynamic storage element; and d) a cycle of steps a-c repeats itself until a predetermined measuring time is completed and the entire data volume is stored.

5. The circuit of claim 4, wherein said controller is configured to control refreshing of said dynamic storage elements such that said data in said dynamic storage elements are refreshed only after completion of said read-in of all of the entire volume of data from said electronic measuring device.

6. A circuit for the continuous and uninterrupted read-in of a given volume of data from an electronic measuring device into a memory, the circuit comprising:

said memory that further comprises at least two dynamic storage elements having an active phase and an inactive phase and said dynamic storage elements being connected in parallel; and a controller operatively connected and configured to control said dynamic storage elements, said controller configured to direct said data to a dynamic storage element prepared for its active phase while another storage element is in its inactive preparatory phase, control of said two storage elements occurring by said controller being configured to operate as follows:

a) during an active phase, measurement data are read into a first storage element, while a second dynamic storage element is in its inactive phase and is being prepared for new data acceptance;

b) when said first dynamic storage element has reached it defined storage capacity, it is automatically switched into its inactive phase, in which preparation for new data read-in occurs while at the same time, said second dynamic storage element is switched into its active phase and accepts data on its part, without loss of measurement data; and c) when said second dynamic storage element has reached its defined recording length, there occurs a changeover to said first dynamic storage element; and d) a cycle of steps a–c repeats itself until a predetermined measuring time is completed and said entire data volume is stored; and wherein said controller is further configured such that data stored in a given dynamic storage element read out from said dynamic storage element during said inactive phases.

* * * * *